(12) United States Patent
Brown et al.

(10) Patent No.: US 8,427,464 B2
(45) Date of Patent: Apr. 23, 2013

(54) DISPLAY DEVICE

(75) Inventors: Christopher Brown, Oxford (GB); Hiromi Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 312 days.

(21) Appl. No.: 13/002,541

(22) PCT Filed: Jul. 1, 2009

(86) PCT No.: PCT/JP2009/062045
§ 371 (c)(1),
(2), (4) Date: Jan. 4, 2011

(87) PCT Pub. No.: WO2010/007890
PCT Pub. Date: Jan. 21, 2010

(65) Prior Publication Data
US 2011/0109601 A1    May 12, 2011

(30) Foreign Application Priority Data
Jul. 16, 2008  (JP) ................................ 2008-185194

(51) Int. Cl.
   *G06F 3/038*   (2006.01)
(52) U.S. Cl.
   USPC ........... 345/207; 345/208; 345/690; 348/241; 348/308
(58) Field of Classification Search .............. 345/38–42, 345/60–73, 87–104, 207–208, 690; 348/222.1–308; 313/504; 315/291–312
   See application file for complete search history.

(56) References Cited

U.S. PATENT DOCUMENTS 6,229,505 B1    5/2001  Fujii
6,317,154 B2 *  11/2001 Beiley ........................... 348/308
(Continued)

FOREIGN PATENT DOCUMENTS

CN           1607561 A      4/2005
CN         101105614 A      1/2008
(Continued)

OTHER PUBLICATIONS

International Search Report dated Sep. 8, 2009 for PCT/JP2009/060081.

(Continued)

*Primary Examiner* — Amare Mengistu
*Assistant Examiner* — Vinh Lam
(74) *Attorney, Agent, or Firm* — Birch, Stewart, Kolasch & Birch, LLP (57) ABSTRACT

Provided is a display device including a photoreception unit on an active matrix substrate in correspondence with one or two or more pixels, and a driving unit that drives the photoreception unit. The photoreception unit includes a photodiode, a capacitor that accumulates a charge in accordance with the electrical signal from when a reset signal (RST) from the driving unit has switched from the high level to the low level to when a readout signal (RWS) at the high level from the driving unit has been applied, and a switching element that, while the readout signal (RWS) is at the high level, allows output of a photoreception signal whose output level changes in accordance with the amount of accumulated charge. In a row selection period, after writing of an image signal to pixel electrodes in the row selected in the row selection period has ended, the driving unit switches the reset signal (RST) applied to the photoreception unit in the same row from the high level to the low level.

8 Claims, 9 Drawing Sheets

U.S. PATENT DOCUMENTS

| | | | |
|---|---|---|---|
| 6,479,940 B1 | 11/2002 | Ishizuka | |
| 6,753,912 B1 * | 6/2004 | Wayne | 348/241 |
| 6,937,224 B1 * | 8/2005 | Miyachi | 345/102 |
| 7,889,412 B2 * | 2/2011 | Futatsuya et al. | 359/245 |
| 2005/0045881 A1 | 3/2005 | Nakamura et al. | |
| 2005/0046331 A1 | 3/2005 | Kim et al. | |
| 2005/0082968 A1 | 4/2005 | Choi et al. | |
| 2005/0212916 A1 | 9/2005 | Nakamura et al. | |
| 2005/0225546 A1 | 10/2005 | Akimoto | |
| 2006/0033016 A1 | 2/2006 | Ogawa et al. | |
| 2006/0256093 A1 | 11/2006 | Furukawa et al. | |
| 2006/0262110 A1 | 11/2006 | Fukuda et al. | |
| 2007/0070056 A1 | 3/2007 | Sato et al. | |
| 2007/0132710 A1 * | 6/2007 | Tateuchi et al. | 345/102 |
| 2007/0268206 A1 | 11/2007 | Kinoshita et al. | |
| 2009/0271723 A1 * | 10/2009 | Matsushima et al. | 715/769 |
| 2009/0312987 A1 | 12/2009 | Uedaira et al. | |
| 2010/0002016 A1 * | 1/2010 | Kim | 345/660 |

FOREIGN PATENT DOCUMENTS

| | | |
|---|---|---|
| JP | 2005-300630 A | 10/2005 |
| JP | 2005-328352 A | 11/2005 |
| JP | 2006-3857 A | 1/2006 |
| JP | 2006-79589 A | 3/2006 |
| JP | 2006-317682 A | 11/2006 |
| JP | 2006-323261 A | 11/2006 |
| JP | 2007-94606 A | 4/2007 |
| JP | 2007-304245 A | 11/2007 |
| JP | 2007-310628 A | 11/2007 |
| WO | WO 2007/145346 A1 | 12/2007 |
| WO | WO 2007/145347 A1 | 12/2007 |

OTHER PUBLICATIONS

International Search Report for PCT/JP2009/058319 mailed Jul. 14, 2009.

Nakamura et al., "A Touch Panel Function Integrated LCD Including LTPS AD Converter", SID 05 DIGEST, pp. 1054-1055, 2005.

Notice of Allowance for copending U.S. Appl. No. 13/061,603 issued on Sep. 7, 2011.

Office Action dated Jan. 14, 2013 for the corresponding Chinese Patent Application No. 200980134642.8 with English translation.

* cited by examiner

DISPLAY DEVICE

TECHNICAL FIELD

The present invention relates to a display device, and in particular to a display device with a photosensor that has an image input function due to including a photodetection element in a pixel.

BACKGROUND ART

Conventionally, there has been proposed a display device with a photosensor that, due to including a photodetection element such as a photodiode inside a pixel, can detect the brightness of external light and pick up an image of an object that has come close to the display. Such a display device with a photosensor is envisioned to be used as a bidirectional communication display device or display device with a touch panel function.

In a conventional display device with a photosensor, when using a semiconductor process to form known constituent elements such as signal lines, scan lines, TFTs (Thin Film Transistor), and pixel electrodes on an active matrix substrate, a photodiode, peripheral circuits, and the like are simultaneously formed on the active matrix substrate (see PTL 1).

A photodiode outputs an electrical signal in accordance with the amount of incident light. Each photodiode is provided with a peripheral circuit that includes a capacitor. For example, each peripheral circuit accumulates a charge in the capacitor in accordance with the level of the electrical signal output by the photodiode, and furthermore generates a photoreception signal whose voltage level varies in accordance with the amount of accumulated charge. Also, each peripheral circuit causes the capacitor to discharge an amount of accumulated charge in accordance with the level of the electrical signal that has been output by the photodiode, and generates a photoreception signal whose voltage level varies in accordance with the amount of charge remaining in the capacitor. Furthermore, each peripheral circuit outputs this photoreception signal to a detection circuit provided outside the display region via a readout line that extends in the vertical direction of the screen.

The detection circuit gathers the signals output by the peripheral circuits, generates image data, performs image processing on the image data, and thereafter outputs the resultant image data to the outside. In this way, the liquid crystal display device disclosed in PTL 1 enables pickup of an image of an object on the observer side of the display screen of the liquid crystal panel.

CITATION LIST

Patent Literature
  PTL 1: JP 2006-3857A

DISCLOSURE OF INVENTION

Problem to be Solved by the Invention

Incidentally, in the case where the peripheral circuit of a photodiode is provided inside a pixel as with the display device disclosed in the above-described PTL 1, the peripheral circuit is near elements, wiring, and the common electrode that configure the pixel, thus forming a parasitic capacitor with them. Such a parasitic capacitor influences the operation of the pixel, the photodiode, and the peripheral circuit, particularly when the amount of accumulated charge fluctuates, and may reduce the image quality of a display image and a pick-up image.

An object of the present invention is to solve the above-described problems and provide a display device including an image input function that can suppress a reduction in the image quality of a display image and a pick-up image due to a parasitic capacitor.

Means for Solving Problem

In order to achieve the above-described object, a display device according to the present invention is a display device including an active matrix substrate on which pixels having an active element and a pixel electrode are disposed in a matrix, the display device including: a photoreception unit provided on the active matrix substrate in correspondence with one or two or more of the pixels, and a driving unit that drives the photoreception unit, wherein the photoreception unit includes a photodiode that outputs an electrical signal in accordance with an amount of received light, a capacitor that accumulates a charge in accordance with the electrical signal from when a reset signal from the driving unit has switched from a high level to a low level to when a readout signal at a high level has been applied from the driving unit, and a switching element that, while the readout signal is at the high level, allows output of a photoreception signal whose output level changes in accordance with the amount of accumulated charge, and in a row selection period, after writing of an image signal to the pixel electrodes in the row selected in the row selection period has ended, the driving unit switches the reset signal applied to the photoreception unit in the same row from the high level to the low level.

According to this configuration, in one row selection period, after the writing of a pixel signal to a pixel electrode in the row selected in that row selection period, a reset signal applied to a photoreception unit in the same row is switched from the high level to the low level. This enables suppressing the influence exerted on the capacitor of the photoreception unit by fluctuation in the potential of the pixel electrode, which occurs when the pixel signal was written to the pixel electrode and is due to the parasitic capacitor that has coupled with the pixel electrode. As a result, it is possible to provide a display device including an image input function that can suppress a reduction in the image quality of a display image and a pick-up image due to a parasitic capacitor.

Effects of the Invention

The present invention enables providing a display device including an image input function that can suppress a reduction in the image quality of a display image and a pick-up image due to a parasitic capacitor.

DESCRIPTION OF THE INVENTION

A display device according to an embodiment of the present invention is a display device including an active matrix substrate on which pixels having an active element and a pixel electrode are disposed in a matrix, the display device including: a photoreception unit provided on the active matrix substrate in correspondence with one or two or more of the pixels, and a driving unit that drives the photoreception unit, wherein the photoreception unit includes a photodiode that outputs an electrical signal in accordance with an amount of received light, a capacitor that accumulates a charge in accordance with the electrical signal from when a reset signal from the driving unit has switched from a high level to a low level to when a readout signal at a high level has been applied from the driving unit, and a switching element that, while the readout signal is at the high level, allows output of a photoreception signal whose output level changes in accordance with the amount of accumulated charge, and in a row selection period, after writing of an image signal to the pixel electrodes in the row selected in the row selection period has ended, the driving unit switches the reset signal applied to the photoreception unit in the same row from the high level to the low level.

According to this configuration, in one row selection period, after the writing of a pixel signal to a pixel electrode in the row selected in that row selection period, a reset signal applied to a photoreception unit in the same row is switched from the high level to the low level. This enables suppressing the influence exerted on the capacitor of the photoreception unit by fluctuation in the potential of the pixel electrode, which occurs when the pixel signal was written to the pixel electrode and is due to the parasitic capacitor that has coupled with the pixel electrode. As a result, it is possible to provide a display device including an image input function that can suppress a reduction in the image quality of a display image and a pick-up image due to a parasitic capacitor.

In the above-described display device, it is preferable that in a row selection period, after writing of an image signal to the pixel electrodes in the row selected in the row selection period has ended, the driving unit switches the reset signal applied to the row from the low level to the high level, and after a subsequent predetermined time period has elapsed, switches the reset signal applied to the row from the high level to the low level, and in the next row selection period, the driving unit switches the readout signal applied to the row from the low level to the high level.

Alternatively, in the above-described display device, a configuration is possible in which in a row selection period, before writing of an image signal to the pixel electrodes in the row selected in the row selection period starts, the driving unit switches the reset signal applied to the row from the low level to the high level, and after the writing of the image signal has ended, switches the reset signal applied to the row from the high level to the low level, and in the next row selection period, the driving unit switches the readout signal applied to the row from the low level to the high level. Also, a configuration is possible in which, furthermore, in a row selection period, before writing that accompanies a change in an image signal to the pixel electrodes in the row selected in the row selection period starts, the driving unit switches the reset signal applied to the row from the low level to the high level, and after the writing that accompanies a change in the image signal has ended, switches the reset signal applied to the row from the high level to the low level, and in the next row selection period, the driving unit switches the readout signal applied to the row from the low level to the high level.

In the above-described display device, a configuration is possible in which the switching element is configured by one transistor, wiring that supplies the reset signal is connected to an anode of the photodiode, a control electrode of the transistor and a cathode of the photodiode are connected to one electrode of the capacitor, one of two electrodes other than the control electrode of the transistor is connected to wiring that supplies a constant voltage, and the other of the two electrodes is connected to wiring that outputs the photoreception signal, and wiring that supplies the readout signal is connected to another electrode of the capacitor.

Alternatively, in the above-described display device, a configuration is possible in which the switching element is configured by a first transistor and a second transistor, wiring that supplies the reset signal is connected to an anode of the photodiode, a control electrode of the first transistor and a cathode of the photodiode are connected to one electrode of the capacitor, one of two electrodes other than the control electrode of the first transistor is connected to wiring that supplies a constant voltage, the other of the two electrodes other than the control electrode of the first transistor is connected to one of two electrodes other than a control electrode of the second transistor, the readout signal wiring is connected to the control electrode of the second transistor, the one of two electrodes other than the control electrode of the second transistor is connected to wiring that supplies the constant voltage, and the other of the two electrodes other than the control electrode of the second transistor is connected to the readout wiring for output current.

Also, in the above-described display device, a configuration is possible in which the switching element is configured by a first transistor, a second transistor, and a third transistor, wiring that supplies the reset signal is connected to a control electrode of the third transistor, a control electrode of the first transistor, a cathode of the photodiode, and one of two electrodes other than the control electrode of the third transistor are connected to one electrode of the capacitor, one of two electrodes other than the control electrode of the first transistor is connected to wiring that supplies a constant voltage, the other of the two electrodes other than the control electrode of the first transistor is connected to one of two electrodes other than a control electrode of the second transistor, the readout signal wiring is connected to the control electrode of the second transistor, the one of two electrodes other than the control electrode of the second transistor is connected to wiring that supplies the constant voltage, the other of the two electrodes other than the control electrode of the second transistor is connected to the readout wiring for output current, the other of the two electrodes other than the control electrode of the third transistor is connected to wiring that supplies the constant voltage, and an anode of the photodiode and another electrode of the capacitor are connected to ground wiring.

Also, the display device according to the present invention can be favorably implemented as a liquid crystal display device further including a common substrate opposing the active matrix substrate, and liquid crystal sandwiched between the active matrix substrate and the common substrate.

Below is a description of a liquid crystal display device according to more specific embodiments of the present invention with reference to the drawings.

Embodiment 1

Figure 1:
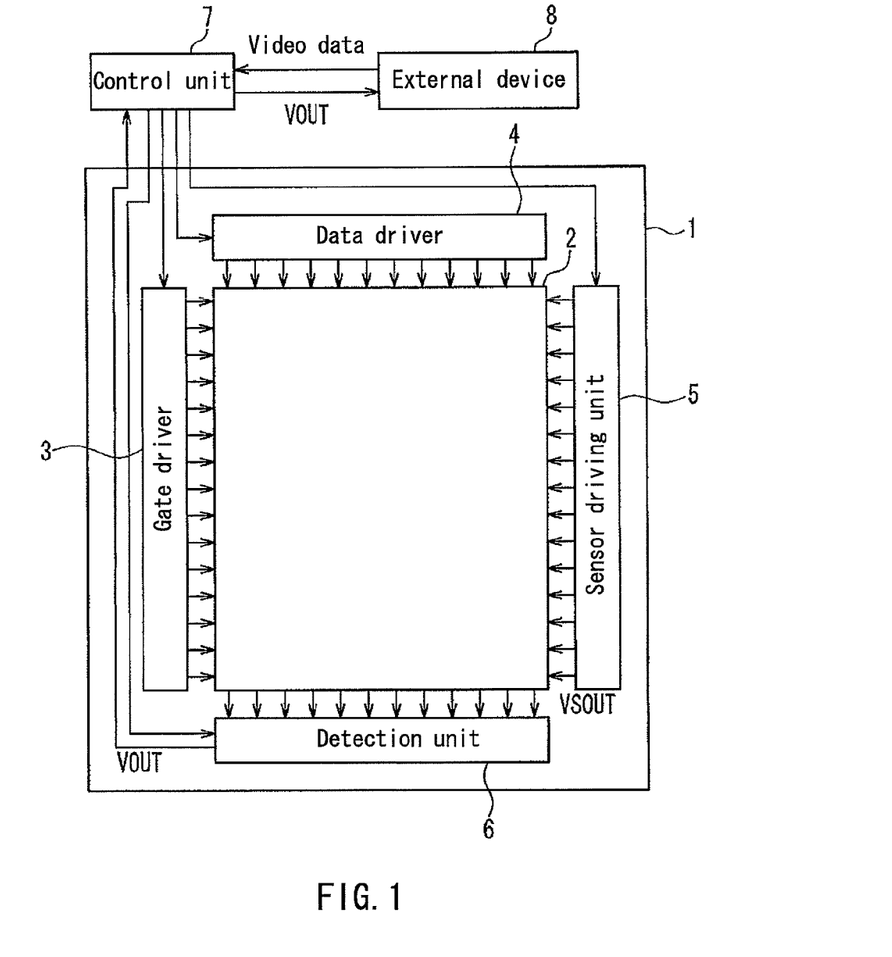
FIG. 1 is a diagram schematically showing an overall configuration of a liquid crystal display device according to Embodiment 1 of the present invention.
Figure 2:
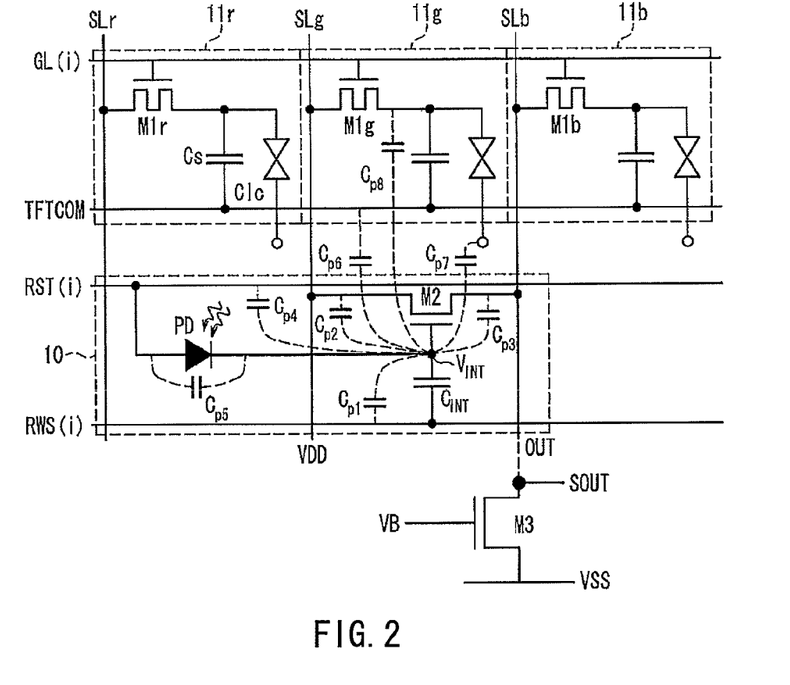
FIG. 2 is a circuit diagram showing a circuit configuration of a pixel and a photoreception unit of the liquid crystal display device shown in FIG. 1.
Figure 3:
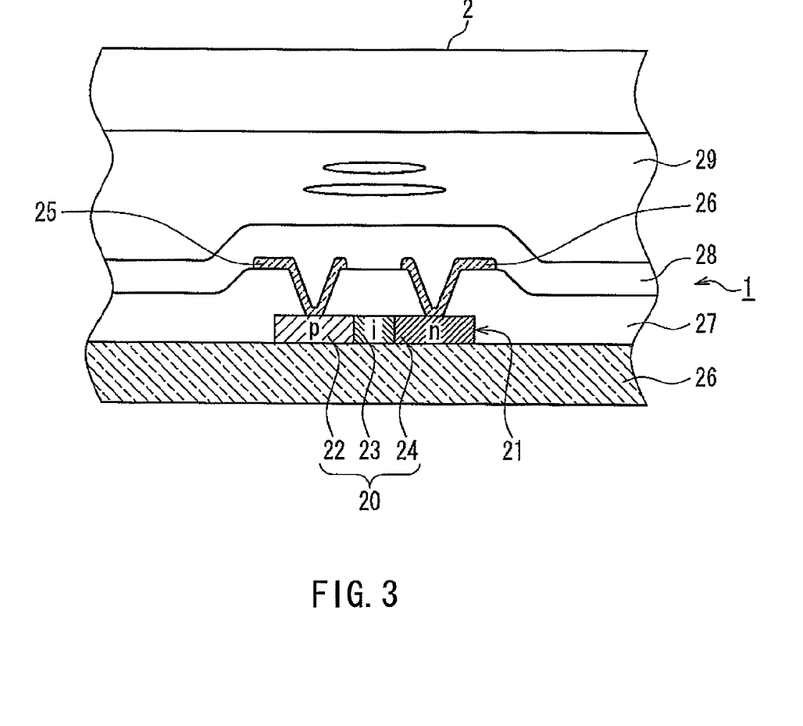
FIG. 3 is a cross-sectional diagram showing a specific configuration of a photodiode configuring the photoreception unit of the liquid crystal display device shown in FIG. 1.

First is a description of a configuration of a liquid crystal display device according to Embodiment 1 of the present invention with reference to FIGS. 1 to 3. FIG. 1 is a diagram schematically showing an overall configuration of a liquid crystal display device according to embodiments of the present invention. As shown in FIG. 1, the liquid crystal display device according to the present embodiment includes an active matrix substrate 1, a common substrate 2, and a liquid crystal layer (not shown) sandwiched between these two substrates. Although not shown, the liquid crystal display device also includes a backlight device that illuminates these two substrates and the liquid crystal layer.

The active matrix substrate 1 includes a glass substrate on which a plurality of sets of active elements and pixel electrodes are formed in a matrix. The region in which the pixels are disposed in a matrix is the display region. The active elements and the pixel electrodes have been omitted from FIG. 1. Each pixel is configured by one set of an active element and a pixel electrode. In the present embodiment, the active elements are TFTs (Thin Film Transistor).

The active matrix substrate 1 also includes a gate driver 3 and a data driver 4 in a region in the periphery of the display region. The active elements are connected to the gate driver 3 by gate lines GL that extend horizontally, and are connected to the data driver 4 by data lines SL that extend vertically (see FIG. 2).

In the present embodiment, wiring (not shown) for forming an accumulation capacitor Cs (see FIG. 2) is also formed in the display region. Also, in the present embodiment, the gate driver 3 and the data driver 4 are also formed monolithically by a silicon film, similarly to the active elements, on the glass substrate configuring the active matrix substrate 1.

However, the embodiments of the present invention are not limited to this, and the gate driver 3 and the data driver 4 may be an IC chip. In this case, the IC chip may be directly mounted on the glass substrate, or may be mounted on an FPC that is connected to the active matrix substrate 1.

Also, in the present embodiment, the liquid crystal display device furthermore includes a control unit 7 that drives the gate driver 3 and the data driver 4. The control unit 7 is connected to an external device 8. The external device 8 is, for example, a computer in the case where the liquid crystal display device is used as a computer monitor. Also, in the case where the liquid crystal display device is used as the display device of a mobile phone or a television, the external device 8 is the control board or the like of the mobile phone or television. The external device 8 inputs video data to the control unit 7.

The control unit 7 inputs a gate start pulse, a clock signal and a control signal to the gate driver 3, for example. Accordingly, in conformity with the timing of the clock signal, the gate driver 3 selects a horizontal line of active elements via a gate line GL. The control unit 7 also inputs video data, a control signal, and a clock signal to the data driver 4. The data driver 4 latches the video data at the timing of the clock signal, and writes the image data to the selected active elements via the data lines SL. According to such operations of the gate driver 3, the data driver 4, and the control unit 7, the pixels are driven and an image is displayed in accordance with the video signal.

The common substrate 2 is disposed so as to overlap with the display region. The common substrate 2 includes a common electrode (not shown) and a color filter. In the present embodiment, the color filter is configured by red (R), green (G), and blue (B) color layers in correspondence with the pixel electrodes. Note that there are no limitations on the configuration of the color layers of the color filter.

Also, in order to provide the liquid crystal display device with an image input function, the liquid crystal display device includes a plurality of photoreception units (not shown in FIG. 1) that output a photoreception signal in accordance with an amount of incident light, a sensor driving unit 5 that drives the photoreception units, and a detection unit 6 that detects the photoreception signals that have been output by the photoreception units. The photoreception units are provided in the display region of the active matrix substrate 1.

The sensor driving unit 5 and the detection unit 6 are formed in a region in the periphery of the display region. In the present embodiment, the sensor driving unit 5 and the detection unit 6 are also formed monolithically by a silicon film, similarly to the active elements, on the glass substrate configuring the active matrix substrate 1.

Below is a description of the configuration of the pixels and the photoreception units with reference to FIG. 2. FIG. 2 is a circuit diagram showing a circuit configuration of a pixel and a photoreception unit of the liquid crystal display device shown in FIG. 1. As shown in FIG. 2, each pixel 11 includes a thin film transistor M1 as an active element. The gate terminal of the thin film transistor M1 is connected to one of the gate lines GL. Also, the drain terminal (or the source terminal) of the thin film transistor M1 is connected to one of the data lines SL.

In FIG. 2, the pixel corresponding to the red color filter is noted as 11r, the pixel corresponding to the green color filter is noted as 11g, and the pixel corresponding to the blue color filter is noted as 11b. Similarly, the thin film transistor in the pixel corresponding to the red color filter is noted as M1r, the thin film transistor in the pixel corresponding to the green color filter is noted as M1g, and the thin film transistor in the pixel corresponding to the blue color filter is noted as M1b. Also, the data line for driving the pixel corresponding to the red color filter is noted as SLr, the data line for driving the pixel corresponding to the green color filter is noted as SLg, and the data line for driving the pixel corresponding to the blue color filter is noted as SLb. However, in the description hereinafter, the letters "r", "g", and "b" in the reference signs have been omitted when there is no need to distinguish between the pixels.

Also, in FIG. 2, the gate line noted by GL(i) corresponds to the gate line in the i-th row in the display region. The same follows for reset signal wiring RST that supplies a reset signal and readout signal wiring RWS that supplies a readout signal.

As shown in FIG. 2, the pixel electrode in each of the pixels 11 and the common electrode of the common substrate 2 (see FIG. 1) form a pixel capacitor Clc (see FIG. 2) whose dielectric body is the liquid crystal layer. Accordingly, the gate driver 3 selects one of the gate lines GL, the data driver 4 outputs video data to the data lines SLr, SLg, and SLb, and a charge is accumulated in the pixel capacitors Clc in the selected row in accordance with the video data. Then the transmissivity of illumination light that passes through the liquid crystal layer changes in accordance with the accumulated charge, and thus a video is displayed.

In the liquid crystal display device, inversion driving for inverting the polarity of the voltage applied to the liquid crystal layer at a constant interval is generally performed in order to prevent liquid crystal burn-in. Specifically, the voltage (common electrode voltage) VCOM applied to the common electrode is switched in each horizontal period, for example.

Also, as shown in FIG. 2, each photoreception unit 10 includes a photodiode PD, a capacitor $C_{INT}$, and a thin film transistor M2. In the present embodiment, one photoreception unit 10 is provided per three pixels, namely a red pixel, a green pixel, and a blue pixel. The photodiode PD receives incident light via the common substrate 2 and the liquid crystal layer, and outputs an electrical signal in accordance with the amount of received light. In the present embodiment, a PIN diode is used as the photodiode PD. The configuration of the photodiode PD will be described later with reference to FIG. 3.

The capacitor $C_{INT}$ accumulates a charge in accordance with the electrical signal output by the photodiode PD. Also, the charge accumulated by the capacitor $C_{INT}$ is reset by the reset signal output by the sensor driving unit 5. The photoreception unit 10 outputs a photoreception signal VSOUT whose level changes in accordance with the amount of accumulated charge. The start and stop of the output of the photoreception signal VSOUT is performed by the switching on and off of the thin film transistor M2, which is controlled based on the readout signal output by the sensor driving unit 5.

As shown in FIG. 2, the anode of the photodiode PD is connected to one of the terminals of the capacitor $C_{INT}$. The cathode of the photodiode PD is connected to the reset signal wiring RST that supplies the reset signal. The other terminal of the capacitor $C_{INT}$ is connected to the readout signal wiring RWS that supplies the readout signal. Also, the gate terminal of the thin film transistor M2 is connected so as to branch from wiring that connects the anode of the photodiode PD and the one of the terminals of the capacitor $C_{INT}$. $V_{INT}$ indicates the potential at this branch point.

Furthermore, the source (or drain) of the thin film transistor M2 is connected to the data line SLb, and the drain (or source) thereof is connected to the data line SLg. In periods in which image signal writing is not performed, the data line SLg is also used as wiring VDD via which a constant voltage $V_{DD}$ is applied to the source (or drain) of the thin film transistor M2. In periods in which image signal writing is not performed, the data line SLb is also used as wiring OUT via which the photoreception signal VSOUT is output.

In FIG. 2, capacitors $C_{p1}$ to $C_{p8}$ indicate parasitic capacitors formed by the photoreception units 10 along with the pixels and the common substrate. The capacitor $C_{p1}$ is a parasitic capacitor formed with the readout signal wiring RWS that supplies the readout signal. The capacitor $C_{p2}$ is a parasitic capacitor formed with the data line SLg. The capacitor $C_{p3}$ is a parasitic capacitor formed with the data line SLb. The capacitor $C_{p4}$ is a parasitic capacitor formed with the reset signal wiring RST that supplies the reset signal. The capacitor $C_{p5}$ is a parasitic capacitor formed with the photodiode PD. The capacitor $C_{p6}$ is a parasitic capacitor formed with TFTCOM. The capacitor $C_{p7}$ is a parasitic capacitor formed with the common electrode. The capacitor $C_{p8}$ is a parasitic capacitor formed with the pixel electrode. In other words, the potential $V_{INT}$ fluctuates due to being influenced by coupling with the parasitic capacitors $C_{p1}$ to $C_{p8}$. In particular, the value of the capacitor $C_{p8}$ is relatively high. Accordingly, VSOUT, which is the sensor output, is considerably influenced by fluctuation in the potential of the pixel electrode. The configuration of the present embodiment enables obtaining highly precise sensor output by eliminating the influence of the capacitor $C_{p8}$.

Below is a description of a specific configuration of the photodiode PD in the equivalent circuit diagram of FIG. 2, with reference to FIG. 3. FIG. 3 is a cross-sectional diagram showing a specific configuration of a photodiode 20 configuring the photoreception units of the liquid crystal display device shown in FIG. 1.

As shown in FIG. 3, the photodiode 20 is a PIN diode having a lateral structure. The photodiode 20 is formed in a silicon film 21 provided on a glass substrate 26 that is the base substrate of the active matrix substrate 1.

The silicon film 21 is formed in the process for forming the thin film transistors M1 and M2 (see FIG. 2), at the same time as the thin film transistors M1 and M2. In the present embodiment, the silicon film 21 and the silicon film forming the thin film transistors M1 and M2 are formed by continuous grain silicon (CGS), which is superior in terms of charge transfer rate. Also, the silicon film 21 is provided with a p-type semiconductor region (p layer) 22, an intrinsic semiconductor region (i layer) 23, and an n-type semiconductor region (n layer) 24 in the stated order along the surface direction.

The i layer 23 is the photodetection region in the photodiode 20. In the present embodiment, the i layer 23 needs only be a region that is nearly electrically neutral in comparison with the adjacent p layer 22 and n layer 24. The i layer 23 is preferably a region that includes no impurities whatsoever, or a region whose conduction electron density and hole density are equivalent.

The photodiode 20 is covered by interlayer insulating films 27 and 28. In FIG. 3, wiring connected to the p layer 22 is indicated by 25, and wiring connected to the n layer 24 is indicated by 26. The liquid crystal layer is indicated by 29. Only the outline of the common substrate 2 is shown.

Although not shown in FIG. 1 or 2, the detection unit 6 includes a sampling circuit and an amplification circuit. The detection unit 6 converts the photoreception signal VSOUT into a voltage signal, and furthermore amplifies the voltage signal, thus generating an image signal VOUT. The image signal VOUT is output from the detection unit 6 to the control unit 7, and thereafter output to the external device 8. As will be described later, in the present embodiment the sensor driving unit 5 outputs a reset signal and a readout signal for each horizontal line of photoreception units 10. For this reason, the detection unit 6 outputs the image signal VOUT for each photoreception signal output by a horizontal line of photoreception units 10.

Figure 4:
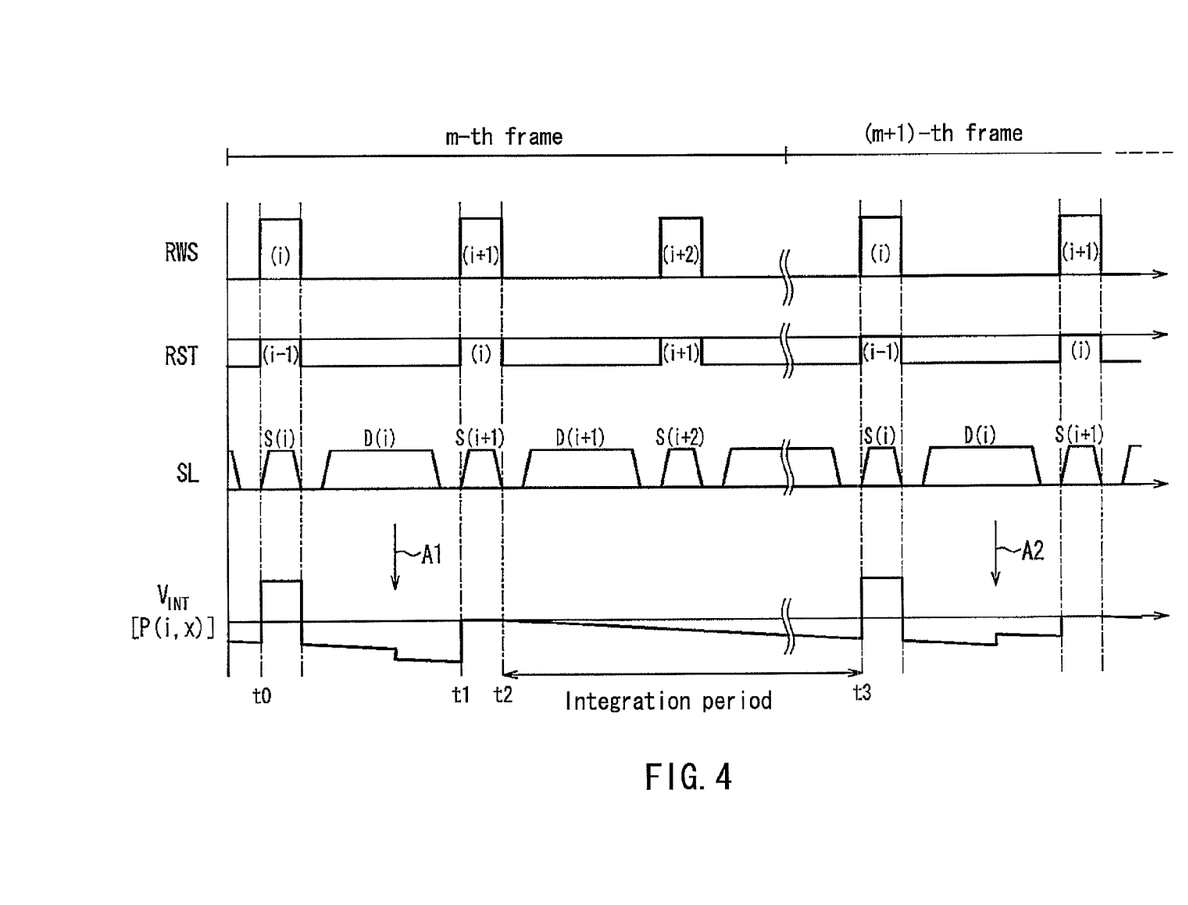
FIG. 4 is a timing chart showing a waveform of a signal supplied to readout signal wiring RWS, a waveform of a signal supplied to reset signal wiring RST, a waveform of a signal supplied to data lines SL, and fluctuation in the potential of $V_{INT}$, in the photoreception unit shown in FIG. 2.

Below is a description of operations by which sensor output is read out in the configuration of the present embodiment with reference to FIG. 4. FIG. 4 is a timing chart showing a waveform of a signal supplied to the readout signal wiring RWS, a waveform of a signal supplied to the reset signal wiring RST, a waveform of a signal supplied to the data lines SL, and fluctuation in the potential of $V_{INT}$ in the photoreception unit 10 shown in FIG. 2.

Note that i−1, i, i+1, . . . in FIG. 4 shown in connection with the signal supplied to the readout signal wiring RWS and the signal supplied to the reset signal wiring RST indicate the row number of the wiring to which the corresponding pulses are applied (see FIG. 2). It should also be noted that $V_{INT}$ in FIG. 4 indicates fluctuation in the potential of $V_{INT}$ in the photoreception unit 10 provided in the pixel that is in the i-th row and furthermore the x-th column (noted as P(i,x) in FIG. 4).

The sensor driving unit 5 successively selects each set of reset signal wiring RST(i) and readout signal wiring RWS(i) shown in FIG. 2 at a predetermined time interval. Accordingly, each photosensor row in the pixel region 1 from which a signal charge is to be read is successively selected.

Note that as shown in FIG. 2, the end of the wiring OUT is connected to the drain of a thin film transistor M3, which is an insulated gate field effect transistor. Also, the drain of the thin film transistor M3 is connected to the output wiring SOUT. The source of the thin film transistor M3 is connected to wiring VSS. The gate of the thin film transistor M3 is connected to a reference voltage power supply (not shown) via reference voltage wiring VB.

As shown in FIG. 4, at a time t1, when the high level (0 V) reset signal is applied to the reset signal wiring RST in the i-th row, $V_{INT}$ in P(i,x) becomes 0 V, and the charge accumulated in the capacitor $C_{INT}$ is reset. Thereafter, at a time t2, when the reset signal is switched from the high level to the low level (e.g., −4 V), a negative voltage is applied to the cathode of the photodiode PD in P(i,x). If light is incident on the photodiode PD in this state, a charge is accumulated in the capacitor $C_{INT}$, and $V_{INT}$ drops in accordance with the amount of accumulated charge. At a time t3, when the high level (e.g., 8 V) readout signal is applied to the readout signal wiring RWS in the i-th row, $V_{INT}$ in P(i,x) steeply rises to the threshold voltage of the thin film transistor M2 or higher and becomes a voltage in accordance with the amount of charge accumulated in the capacitor $C_{INT}$. As a result, the thin film transistor M2 enters the conductive state due to the channel thereof being opened, thus functioning as a source follower amplifier along with the bias thin film transistor M3 provided at the end of the wiring OUT in each row. In other words, the output signal voltage from the output wiring SOUT connected to the drain of the thin film transistor M3 corresponds to the integral value of a photocurrent $I_{PHOTO}$ generated due to light that has been incident on the photodiode PD in the integration period. Note that the readout signal applied to the i-th row at the time t3 is applied in the frame (the (m+1)-th frame in FIG. 4) after the frame in which the reset signal is applied to the i-th row (the m-th frame in FIG. 4).

As can be seen in FIG. 4, in P(i,x), in the integration period from the time t2 to the time t3, the pixels in the (i+1)-th row are selected, and the writing of image signals from the data lines SL is being performed. In other words, image signals are not written to the pixels in the i-th row in the integration period, and therefore the potential of the pixel electrodes in the i-th row does not fluctuate. Accordingly, $V_{INT}$ of the pixel P(i,x) in the i-th row is not influenced by the parasitic capacitor $C_{p8}$ shown in FIG. 2 in the integration period.

Note that as shown by an arrow A1 in FIG. 4, in the period from when the readout signal is applied to the readout signal wiring RWS in the i-th row in a certain frame to when the reset signal is applied to the reset signal wiring RST in the i-th row in the same frame (time t0 to t1), there are cases where $V_{INT}$ fluctuates due the influence of a parasitic capacitor that accompanies the writing of data to the pixel electrodes in the i-th row. However, the fluctuation in $V_{INT}$ during this period is not readout as the photoreception signal VSOUT, and therefore there is no influence whatsoever on the sensor output. The same follows for the place indicated by an arrow A2. Note that the difference in the direction in which $V_{INT}$ fluctuates at the two places indicated by the arrows A1 and A2 in FIG. 4 is due to the difference in the direction of change in the tone of the image signal written to the pixel electrodes at the corresponding timings.

As described above, in the present embodiment, in the m-th frame, after the writing of data to the pixel electrodes in the i-th row, a reset signal is applied to the reset wiring in the same i-th row, and in the (m+1)-th frame, sensor output is read out from the photoreception units 10 in the i-th row. Accordingly, fluctuation in the potential of the pixel electrodes that accompanies the writing of data to the pixel electrodes in the i-th row does not influence the sensor output, and it is possible to obtain accurate sensor output that is in accordance with the amount of received light.

Note that although the example in which one thin film transistor (the thin film transistor M2) serves as the peripheral circuit of the photodiode in the photoreception unit 10 is shown in FIG. 2 and the above description, the present invention is also applicable to a configuration in which two or three thin film transistors serve as peripheral circuits.

Figure 5:
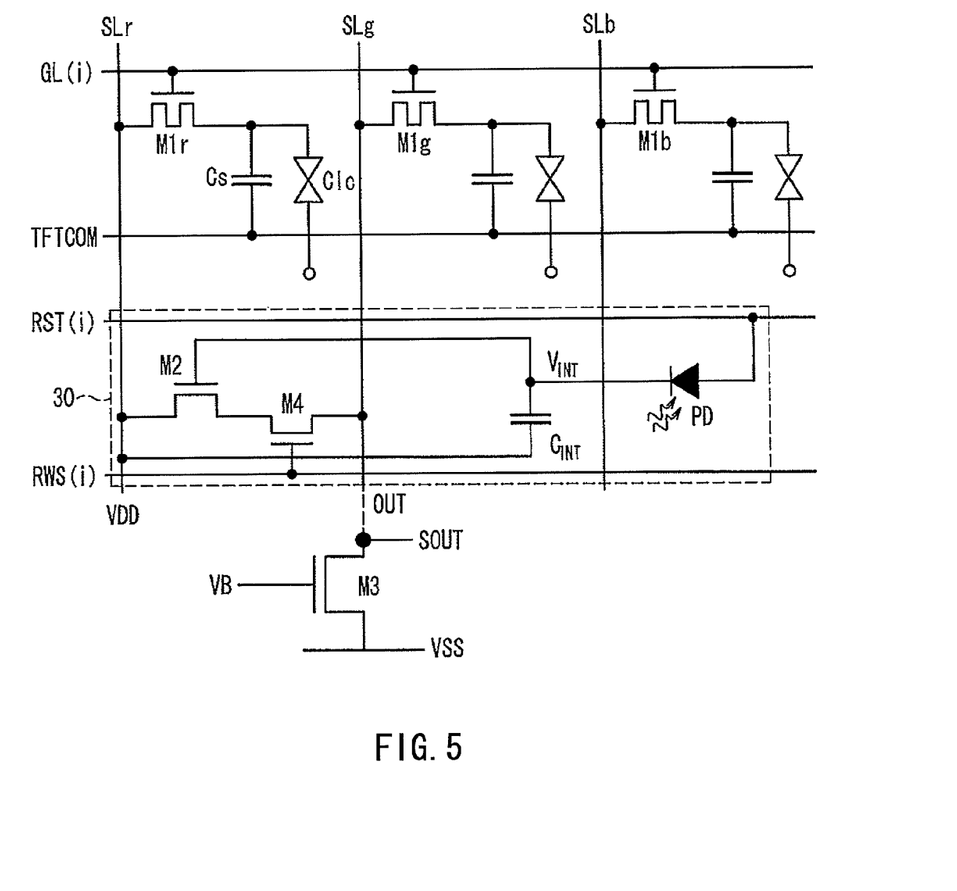
FIG. 5 is an equivalent circuit diagram showing a configuration of a pixel in a variation of the display device according to Embodiment 1.

Below is a description of a configuration in the case where two thin film transistors serve as peripheral circuits with reference to FIG. 5, as a variation of the display device according to Embodiment 1. FIG. 5 is an equivalent circuit diagram showing a configuration of a pixel in this variation of the display device according to Embodiment 1. In the configuration shown in FIG. 5, a photoreception unit 30 includes a thin film transistor M4 in addition to the photodiode PD, the capacitor $C_{INT}$, and the thin film transistor M2. Note that FIG. 5 is merely an equivalent circuit diagram, and the disposition of the photodiode PD and the elements of peripheral circuits is not limited to the layout shown in FIG. 5.

In the photoreception unit 30 in FIG. 5, one of the electrodes of the capacitor $C_{INT}$ is connected to the cathode of the photodiode PD and the gate electrode of the thin film transistor M2, and the other electrode of the capacitor $C_{INT}$ is connected to the wiring VDD. Also, the drain (or source) of the thin film transistor M2 is connected to the wiring VDD, and the source (or drain) thereof is connected to the drain (or source) of the thin film transistor M4. The gate of the thin film transistor M4 is connected to the readout signal wiring RWS. The source (or drain) of the thin film transistor M4 is connected to the wiring OUT. Note that although the configuration in which one of the electrodes of the capacitor $C_{INT}$ and the drain (or source) of the thin film transistor M4 are both connected in common to constant voltage wiring (wiring VDD) is shown in this example, a configuration is possible in which they are connected to mutually different constant voltage wiring.

Figure 6:
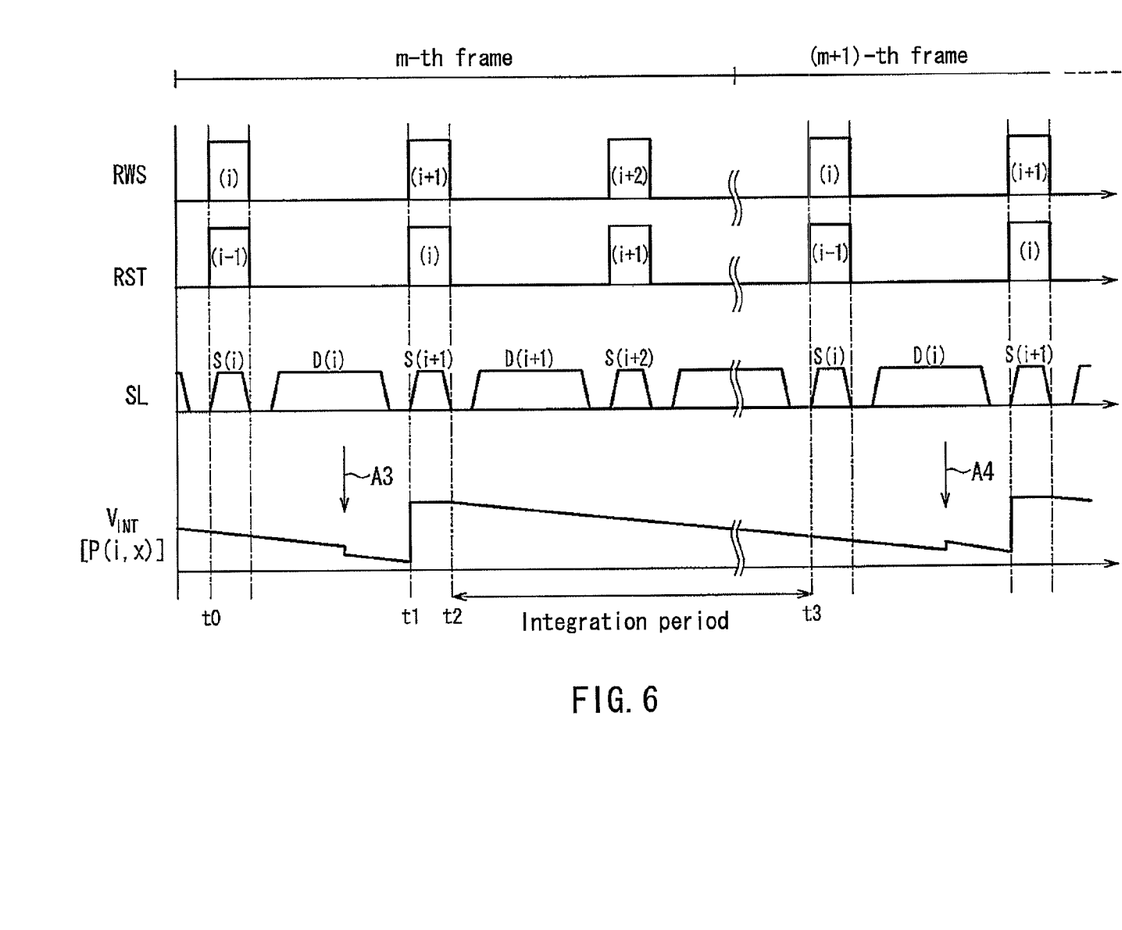
FIG. 6 is a timing chart showing a waveform of a signal supplied to the readout signal wiring RWS, a waveform of a signal supplied to the reset signal wiring RST, a waveform of a signal supplied to the data lines SL, and fluctuation in the potential of $V_{INT}$, in the photoreception unit shown in FIG. 5.

Below is a description of operations of the photoreception unit 30 shown in FIG. 5, with reference to FIG. 6. FIG. 6 is a timing chart showing a waveform of a signal supplied to the readout signal wiring RWS, a waveform of a signal supplied to the reset signal wiring RST, a waveform of a signal supplied to the data lines SL, and fluctuation in the potential of $V_{INT}$ in the photoreception unit 30 shown in FIG. 5.

In the example in FIG. 6, the high level of the reset signal is set to the potential at which the thin film transistor M2 enters the on state (e.g., 8 V=$V_{DD}$). Also, the low level of the reset signal is, for example, 0 V=$V_{SS}$. Furthermore, the high level of the readout signal is 8 V, and the low level thereof is 0 V.

Firstly, at the time t1, when the reset signal supplied from the sensor driving unit 5 to the reset signal wiring RST in the i-th row rises from the low level (0 V) to the high level (8 V), the photodiode PD becomes forward biased. At this time, although the thin film transistor M2 enters the on state, the readout signal supplied to the readout signal wiring RWS in the same i-th row is at the low level, and the thin film transistor M4 is in the off state, and therefore nothing is output to the wiring OUT.

Next, at the time t2, the reset signal in the i-th row returns to the low level, and thus the integration period for photocurrent in the photoreception units 30 in the i-th row begins. In the integration period (time t2 to t3), current from the photodiode PD flows out of the capacitor $C_{INT}$, and thus the capacitor $C_{INT}$ discharges. In the integration period, $V_{INT}$ drops from the reset potential (8 V in this example) in accordance with the intensity of incident light. However, nothing is output to the wiring OUT since the thin film transistor M4 is in the off state. Note that the peripheral circuits of the photodiode PD are desirably designed such that the sensor output is the lowest in the case where the photodiode PD has been irradiated with light whose brightness is the maximum value that is to be detected, that is to say, such that the potential ($V_{INT}$) of the gate electrode of the thin film transistor M2 takes a value that slightly exceeds the threshold in this case. According to such a design, if the photodiode PD has been irradiated with light whose brightness exceeds the maximum value to be detected, the value of $V_{INT}$ falls below the threshold of the thin film transistor M2 and the thin film transistor M2 enters the off state, and thus nothing is output to the wiring OUT.

When the integration period ends at the time t3, the readout signal (the signal supplied to the readout signal wiring RWS) for the i-th row rises, and thus the readout period begins. In the readout period, the readout signal for the i-th row rises to the high level, and thus the thin film transistor M4 enters the on state. Accordingly, output from the photoreception units 30 in the i-th row is output from the thin film transistor M2 to the wiring OUT via the thin film transistor M4. At this time, the thin film transistor M2 functions as a source follower amplifier along with the bias thin film transistor M3 provided at the end of the wiring OUT in each column. In other words, the output signal voltage from the output wiring SOUT corresponds to the integral value of the photocurrent generated due to light that has been incident on the photodiode PD in the integration period.

Note that as shown by an arrow A3 in FIG. 6, in the period from when the readout signal is applied to the readout signal wiring RWS in the i-th row in a certain frame to when the reset signal is applied to the reset signal wiring RST in the i-th row in the same frame (time t0 to t1), there are cases where $V_{INT}$ fluctuates due to the influence of a parasitic capacitor that accompanies the writing of data to the pixel electrodes in the i-th row. However, the fluctuation of $V_{INT}$ during this period is not readout as the photoreception signal VSOUT, and therefore there is no influence whatsoever on the sensor output. The same follows for the place indicated by an arrow A4. Note that the difference in the direction in which $V_{INT}$ fluctuates at the two places indicated by the arrows A3 and A4 in FIG. 6 is due to the difference in the direction of change in the tone of the image signal written to the pixel electrodes at the corresponding timings.

As described above, even with the configuration of the present embodiment shown in FIG. 5, in the m-th frame, after the writing of data to the pixel electrodes in the i-th row, a reset signal is applied to the reset signal wiring RST in the same i-th row, and in the (m+1)-th frame, sensor output is read out from the photoreception units 30 in the i-th row. Accordingly, fluctuation in the potential of the pixel electrodes that accompanies the writing of data to the pixel electrodes in the i-th row does not influence the sensor output, and it is possible to obtain accurate sensor output that is in accordance with the amount of received light.

Figure 7:
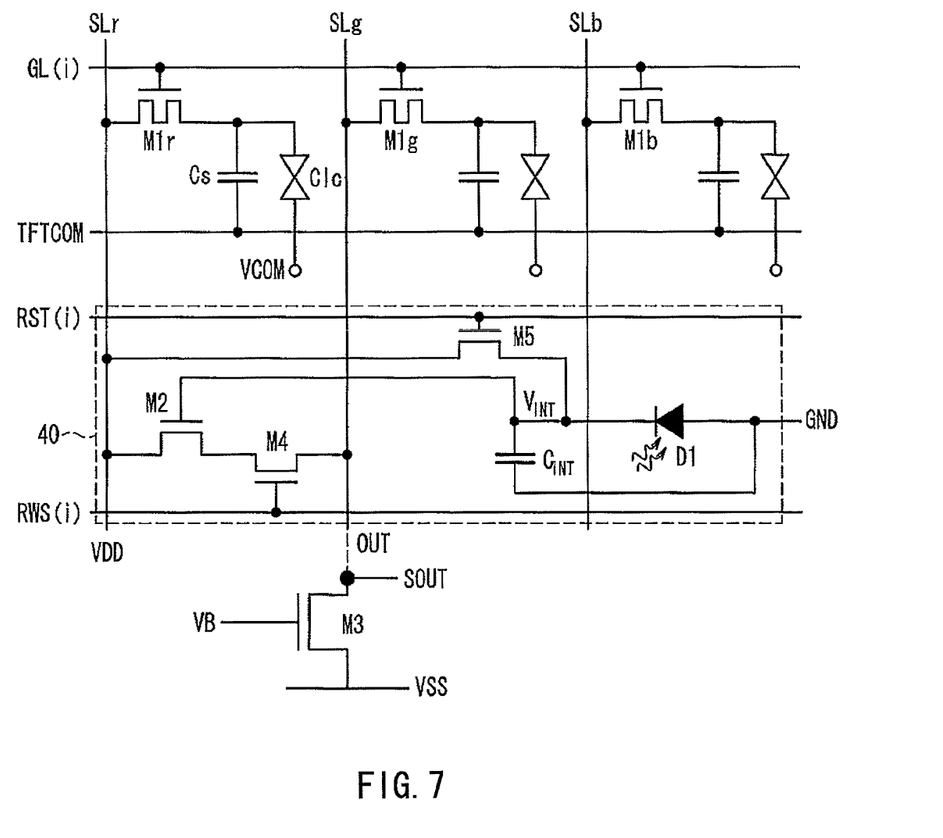
FIG. 7 is an equivalent circuit diagram showing a configuration of a pixel in another variation of the display device according to Embodiment 1.

Below is a description of a configuration in the case where three thin film transistors serve as peripheral circuits of the photodiode PD with reference to FIG. 7, as another variation of the display device according to Embodiment 1. FIG. 7 is an equivalent circuit diagram showing a configuration of a pixel of another variation of the display device according to Embodiment 1. In the configuration shown in FIG. 7, a photoreception unit 40 includes a thin film transistor M5 in addition to the photodiode PD, the capacitor $C_{INT}$, and the thin film transistors M2 and M4. Note that FIG. 7 is merely an equivalent circuit diagram, and the disposition of the photodiode PD and the elements of the peripheral circuits is not limited to the layout shown in FIG. 7.

In the photoreception unit 40 shown in FIG. 7, one of the electrodes of the capacitor $C_{INT}$ is connected to the cathode of the photodiode PD, and the other electrode of the capacitor $C_{INT}$ is connected to GND. The gate of the thin film transistor M2 is also connected to the cathode of the photodiode PD. Also, the drain (or source) of the thin film transistor M2 is connected to the wiring VDD, and the source (or drain) thereof is connected to the drain (or source) of the thin film transistor M4. The gate of the thin film transistor M4 is connected to the readout signal wiring RWS. The source (or drain) of the thin film transistor M4 is connected to the wiring OUT. The gate of the thin film transistor M5 is connected to the reset signal wiring RST, the drain (or source) thereof is connected to the wiring VDD, and the source (or drain) thereof is connected to the cathode of the photodiode PD. Note that although the configuration in which the drains of the thin film transistors M4 and M5 are both connected in common to constant voltage wiring (wiring VDD) is shown in this example, a configuration is possible in which they are connected to mutually different constant voltage wiring.

Below is a description of operations of the photoreception unit 40 shown in FIG. 7. Note that in the photoreception unit 40, the waveforms of the reset signal supplied from the reset signal wiring RST and the readout signal supplied from the readout signal wiring RWS are the same as the waveforms (FIG. 6) of the signals for the photoreception unit 30 shown in FIG. 5. Also, the waveform diagram showing a relationship between input signals (reset signal and readout signal) and $V_{INT}$ in the photoreception unit 40 is the same as the waveforms (FIG. 6) for the photoreception unit 30 shown in FIG. 5. The following description therefore also makes reference to FIG. 6.

The high level of the reset signal for the photoreception unit 40 shown in FIG. 7 is set to the potential at which the thin film transistor M5 enters the on state. In the example in FIG. 6, the high level of the reset signal is 8 V, and the low level thereof is 0 V. The high level of the readout signal is 8 V, and the low level thereof is 0 V.

First, at the time t1, when the reset signal supplied from the sensor driving unit 5 to the reset signal wiring RST in the i-th row rises from the low level (0 V) to the high level (8 V), the thin film transistor M5 in the photoreception units 40 in the i-th row enters the on state. Accordingly, $V_{INT}$ is reset to $V_{DD}$ in the photoreception units 40 in the i-th row.

Next, at the time t2, the reset signal (the signal supplied to the reset signal wiring RST) for the photoreception units 40 in the i-th row returns to the low level, and thus the photocurrent integration period (time t2 to t3) begins. At this time, the reset signal falls to the low level, and thus the thin film transistor M5 in the photoreception units 40 in the i-th row enters the off state. Here, since the anode of the photodiode PD is at GND and the cathode thereof is at 8 V, a reverse bias is applied to the photodiode PD. In the integration period, photocurrent from the photodiode PD in the photoreception units 40 in the i-th row flows out of the capacitor $C_{INT}$, and thus the capacitor $C_{INT}$ discharges. In the integration period, $V_{INT}$ drops from the reset potential (8 V in this example) in accordance with the intensity of incident light. However, nothing is output to the wiring OUT since the thin film transistor M4 of the photoreception units 40 in the i-th row is in the off state. Note that the sensor circuits are desirably designed such that the sensor output is the lowest in the case where the photodiode PD has been irradiated with light whose brightness is the maximum value that is to be detected, that is to say, such that the potential ($V_{INT}$) of the gate electrode of the thin film transistor M2 takes a value that slightly exceeds the threshold in this case. According to such a design, if the photodiode PD has been irradiated with light whose brightness exceeds the maximum value to be detected, the value of $V_{INT}$ falls below the threshold of the thin film transistor M2 and the thin film transistor M2 enters the off state, and thus nothing is output to the wiring OUT.

When the integration period ends, the readout signal (the signal supplied to the readout signal wiring RWS) for the photoreception units 40 in i-th row rises, and thus the readout period begins. In the readout period, the readout signal for the photoreception units 40 in the i-th row rises to the high level, and thus the thin film transistor M4 of the photoreception units 40 in the i-th row enters the on state. Accordingly, output from the thin film transistor M2 of the photoreception units 40 in the i-th row is output to the wiring OUT via the thin film transistor M4. At this time, the thin film transistor M2 of the photoreception units 40 in the i-th row functions as a source follower amplifier along with the bias thin film transistor M3 provided at the end of the wiring OUT in each column. In other words, the output signal voltage from the output wiring SOUT corresponds to the integral value of the photocurrent generated due to light that has been incident on the photodiode PD in the integration period.

Note that as shown by the arrow A3 in FIG. 6, in the period from when the readout signal is applied to the readout signal wiring RWS in the i-th row in a certain frame to when the reset signal is applied to the reset signal wiring RST in the i-th row in the same frame (time t0 to t1), there are cases where $V_{INT}$ fluctuates due to the influence of a parasitic capacitor that accompanies the writing of data to the pixel electrodes in the i-th row. However, the fluctuation in $V_{INT}$ during this period is not readout as the photoreception signal VSOUT, and therefore there is no influence whatsoever on the sensor output. The same follows for the place indicated by the arrow A4. Note that the difference in the direction in which $V_{INT}$ fluctuates at the two places indicated by the arrows A3 and A4 in FIG. 6 is due to the difference in the direction of change in the tone of the image signal written to the pixel electrodes at the corresponding timings.

As described above, even with the configuration of the present embodiment shown in FIG. 7, in the m-th frame, after the writing of data to the pixel electrodes in the i-th row, a reset signal is applied to the reset signal wiring RST in the same i-th row, and in the (m+1)-th frame, sensor output is read out from the photoreception units 40 in the i-th row. Accordingly, fluctuation in the potential of the pixel electrodes that accompanies the writing of data to the pixel electrodes in the i-th row does not influence the sensor output, and it is possible to obtain accurate sensor output that is in accordance with the amount of received light.

Embodiment 2

Below is a description of a display device according to Embodiment 2 of the present invention. Note that the same reference numerals have been given to constituent elements that have functions likewise to those of the constituent elements described in Embodiment 1, and detailed descriptions thereof have been omitted.

The configurations of the pixels and photoreception units of the display device according to Embodiment 2 are as shown in FIG. 7 of Embodiment 1. In other words, the peripheral circuit of the photodiode PD in the photoreception unit 40 of the display device according to Embodiment 2 includes the capacitor $C_{INT}$ and the three thin film transistors M2, M4, and M5.

Figure 8:
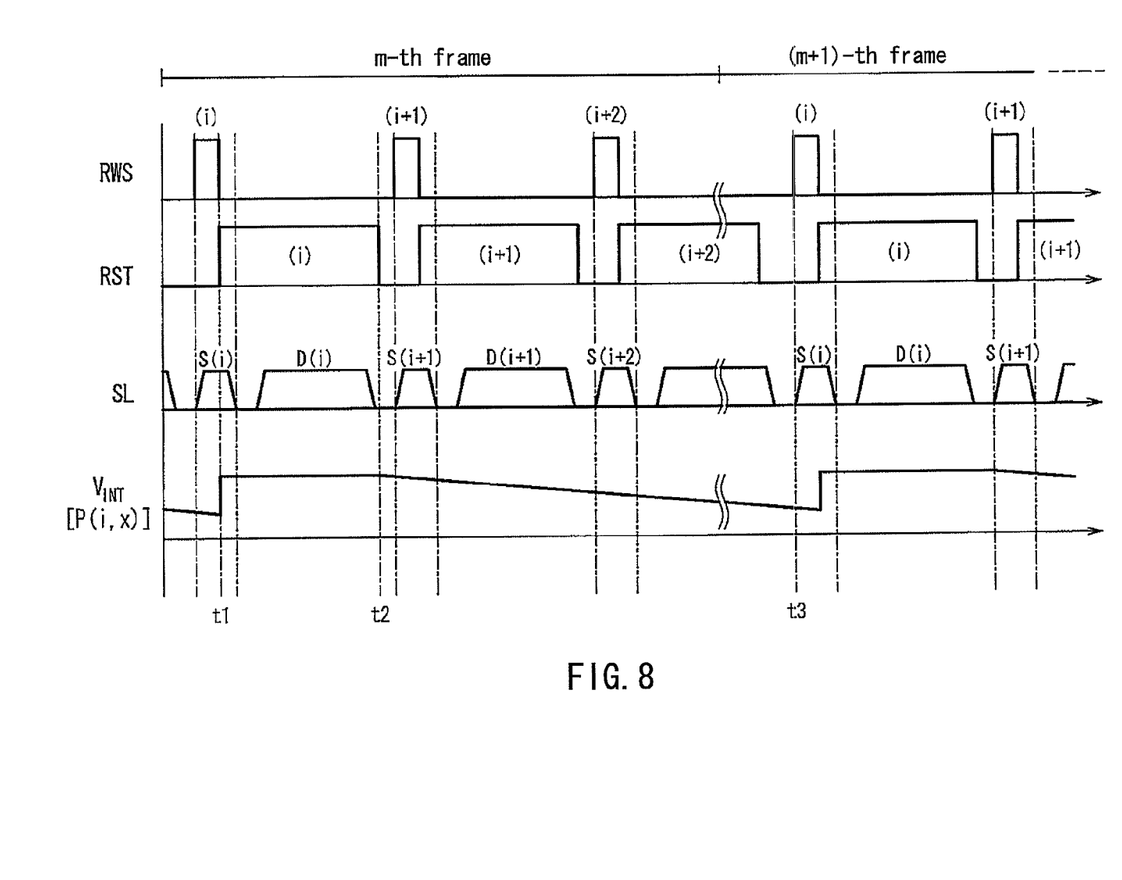
FIG. 8 is a timing chart showing a waveform of a signal supplied to the readout signal wiring RWS, a waveform of a signal supplied to the reset signal wiring RST, a waveform of a signal supplied to the data lines SL, and fluctuation in the potential of $V_{INT}$ according to Embodiment 2.

However, in the display device according to Embodiment 2, the waveforms of the reset signal and the readout signal applied to the photoreception units 40 differ from those in Embodiment 1 shown in FIG. 6. Below is a description of operations of the photoreception unit 40 in the display device according to the present embodiment with reference to FIG. 8. FIG. 8 is a timing chart showing a waveform of the signal supplied to the readout signal wiring RWS, a waveform of the signal supplied to the reset signal wiring RST, a waveform of the signal supplied to the data lines SL, and fluctuation in the potential of $V_{INT}$ according to the present embodiment.

The high level of the reset signal for the photoreception unit 40 shown in FIG. 7 is set to the potential at which the thin film transistor M5 enters the on state. For example, the high level of the reset signal is 8 V ($V_{DD}$), and the low level thereof is 0 V. The high level of the readout signal is 8 V, and the low level thereof is 0 V.

As shown in FIG. 8, in the present embodiment, immediately after the readout signal for the photoreception units 40 in the i-th row has once risen to the high level and then switched to the low level (time t1), the reset signal switches from the low level to the high level. Accordingly, the thin film transistor M5 in the photoreception units 40 in the i-th row enter the on state, and $V_{INT}$ is reset to $V_{DD}$. The reset signal is constantly kept at the high level while the image signal is being written to the pixel electrodes connected to GL in the i-th row. After the writing of the image signal to the pixel electrodes connected to GL in the i-th row has been completed (time t2), the reset signal for the i-th row switches from the high level to the low level. Accordingly, the potential of $V_{INT}$ is sustained at the reset potential (0 V) from the time t1 to the time t2, and photocurrent from the photodiode PD in the photoreception units 40 in the i-th row flows out of the capacitor $C_{INT}$, and thus the capacitor $C_{INT}$ discharges. Specifically, at the time t2, the reset signal falls to the low level, and thus the thin film transistor M5 in the photoreception units 40 in the i-th row enter the off state. Here, since the anode of the photodiode PD is at GND, and the cathode thereof is at 8 V, a reverse bias is applied to the photodiode PD. In the integration period, photocurrent from the photodiode PD in the photoreception units 40 in the i-th row flows out of the capacitor $C_{INT}$, and thus the capacitor $C_{INT}$ discharges. In the integration period, $V_{INT}$ drops from the reset potential (8 V in this example) in accordance with the intensity of incident light. However, nothing is output to the wiring OUT since the thin film transistor M4 of the photoreception units 40 in the i-th row is in the off state.

When the integration period ends, the readout signal (the signal supplied to the readout signal wiring RWS) for the photoreception units 40 in i-th row rises at the time t3, and thus the readout period begins. In the readout period, the readout signal for the photoreception units 40 in the i-th row rises to the high level, and thus the thin film transistor M4 of the photoreception units 40 in the i-th row enters the on state. Accordingly, output from the thin film transistor M2 of the photoreception units 40 in the i-th row is output to the wiring OUT via the thin film transistor M4. At this time, the thin film transistor M2 of the photoreception units 40 in the i-th row functions as a source follower amplifier along with the bias thin film transistor M3 provided at the end of the wiring OUT in each column. In other words, the output signal voltage from the output wiring SOUT corresponds to the integral value of the photocurrent generated due to light that has been incident on the photodiode PD in the integration period.

As described above, according to the driving method shown in FIG. 8, the reset signal (the signal supplied to the reset signal wiring RST) for the i-th row is kept at the high level during the period for writing to the pixel electrodes in the i-th row, and after the writing to the pixel electrodes has been completed, the reset signal is switched to the low level, and the integration period starts. Accordingly, the writing to the pixel electrodes has no influence on $V_{INT}$ of the photoreception units 40, thus enabling obtaining highly precise sensor output.

Figure 9:
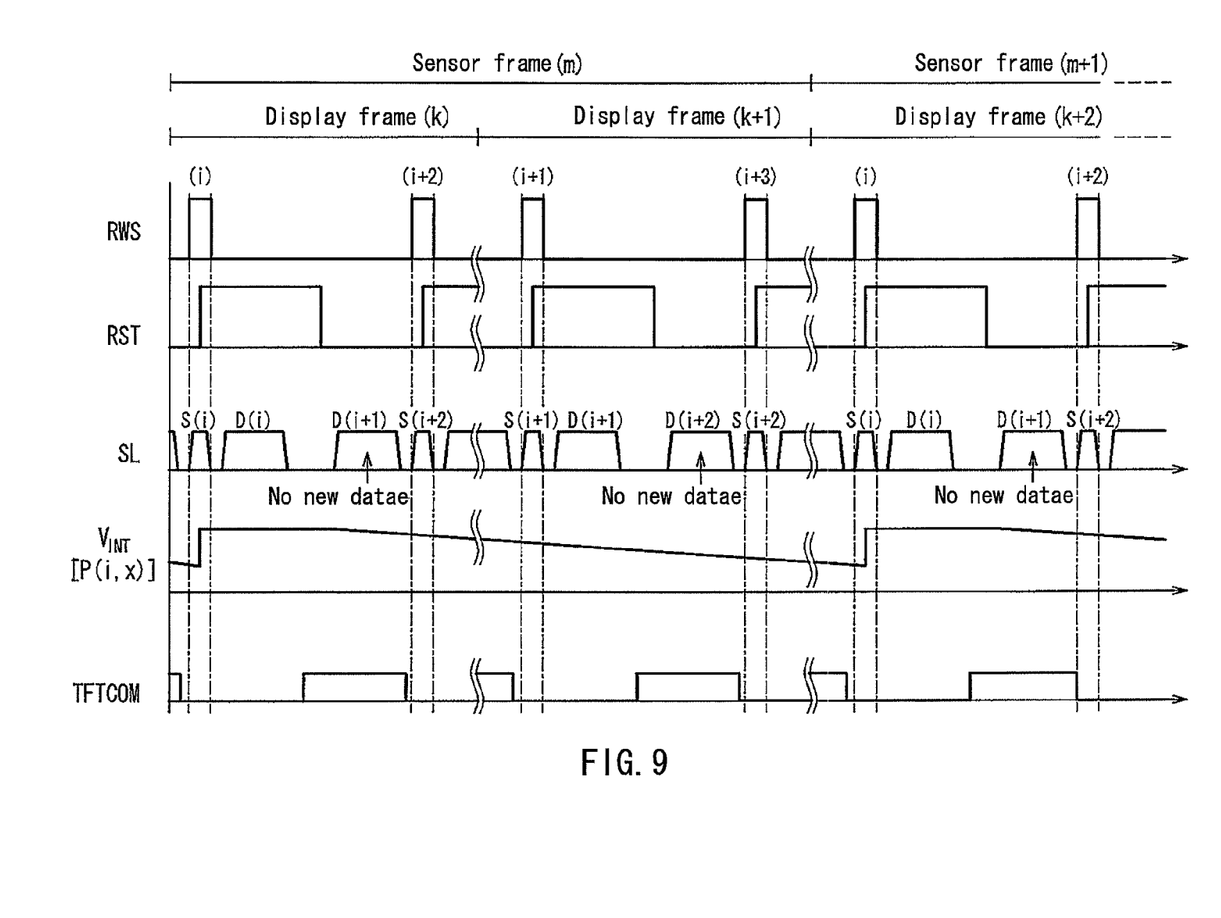
FIG. 9 is a waveform diagram showing timings of various types of signals in the case of interlace driving according to Embodiment 2.

The driving method of the present embodiment can be applied to interlace driving as well. FIG. 9 is a waveform diagram showing timings of various types of signals in the case of interlace driving.

In the case of interlace driving, the writing of one entire screen is performed with use of two frames, namely a frame in which an image signal is written to only odd-numbered rows, and a frame in which an image signal is written to only even-numbered rows. Note that the reading out of sensor output from the photoreception units 40 is performed at the rate of once per two display frames. Accordingly, assuming that the writing cycle of the image signal is 60 Hz, sensor output will be read out at 30 Hz.

In the example in FIG. 9, writing to the odd-numbered rows is performed in the k-th display frame, and writing to the even-numbered rows is performed in the (k+1)-th display frame. Specifically, in the k-th display frame, a new image signal is supplied to only the pixel electrodes in the i-th (i being an odd number) row, and the potential of the previous frame is sustained in the pixel electrodes in the even-numbered rows. In the (k+1)-th display frame, a new image signal is supplied to only the pixel electrodes in the (i+1)-th (i being an odd number) row, and the potential of the previous frame is sustained in the pixel electrodes in the odd-numbered rows.

As shown in FIG. 9, in the present embodiment, the reset signal (the signal supplied to the reset signal wiring RST) is sustained at the high level while writing to the odd-numbered rows is being performed in the k-th display frame. Then, after the writing to the odd-numbered rows has ended, the reset signal is switched from the high level to the low level, and thus the integration period starts, as described above. In the (k+1)-th display frame, the reset signal is sustained at the high level while writing to the even-numbered rows is performed. Then, after the writing to the even-numbered rows has ended, the reset signal is switched from the high level to the low level, and thus the integration period starts, as described above.

In other words, according to the driving method shown in FIG. 9, even in the case of interlace driving, a new image signal is not written to the pixel electrodes in the integration period, thus eliminating the influence on $V_{INT}$ that accompanies fluctuation in the potential of the pixel electrodes and enabling precise sensor output to be obtained.

Although several specific examples of embodiments of the present invention have been described above, the embodiments of the present invention are not limited to only these specific examples, and it is possible to make various changes within the scope of the invention. For example, although a liquid crystal display device is described as an example in the above embodiments, the display device of the present invention is not limited to a liquid crystal display device.

INDUSTRIAL APPLICABILITY

The present invention is industrially applicable as a display device.

REFERENCE SIGNS LIST 1 active matrix substrate
2 common substrate
3 gate driver
4 data driver
5 sensor driving unit
6 detection unit
7 control unit
8 external device
10 photoreception unit
30 photoreception unit
40 photoreception unit
11 pixel
20 photodiode
21 silicon film
22 p layer
23 i layer
24 n layer
25, 26 wiring
27, 28 interlayer insulating film
29 liquid crystal layer

The invention claimed is:

1. A display device comprising an active matrix substrate on which pixels having an active element and a pixel electrode are disposed in a matrix, the display device comprising:
a photoreception unit provided on the active matrix substrate in correspondence with one or two or more of the pixels, and a driving unit that drives the photoreception unit,
wherein the photoreception unit comprises a photodiode that outputs an electrical signal in accordance with an amount of received light, a capacitor that accumulates a charge in accordance with the electrical signal from when a reset signal from the driving unit has switched from a high level to a low level to when a readout signal at a high level has been applied from the driving unit, and a switching element that, while the readout signal is at the high level, allows output of a photoreception signal whose output level changes in accordance with the amount of accumulated charge, and
in a row selection period, after writing of an image signal to the pixel electrodes in the row selected in the row selection period has ended, the driving unit switches the reset signal applied to the photoreception unit in the same row from the high level to the low level.

2. The display device according to claim 1, wherein in a row selection period, after writing of an image signal to the pixel electrodes in the row selected in the row selection period has ended, the driving unit switches the reset signal applied to the row from the low level to the high level, and after a subsequent predetermined time period has elapsed, switches the reset signal applied to the row from the high level to the low level, and in the next row selection period, the driving unit switches the readout signal applied to the row from the low level to the high level.

3. The display device according to claim 1, wherein in a row selection period, before writing of an image signal to the pixel electrodes in the row selected in the row selection period starts, the driving unit switches the reset signal applied to the row from the low level to the high level, and after the writing of the image signal has ended, switches the reset signal applied to the row from the high level to the low level, and in the next row selection period, the driving unit switches the readout signal applied to the row from the low level to the high level.

4. The display device according to claim 3, wherein in a row selection period, before writing that accompanies a change in an image signal to the pixel electrodes in the row selected in the row selection period starts, the driving unit switches the reset signal applied to the row from the low level to the high level, and after the writing that accompanies a change in the image signal has ended, switches the reset signal applied to the row from the high level to the low level, and in the next row selection period, the driving unit switches the readout signal applied to the row from the low level to the high level.

5. The display device according to claim 2,
wherein the switching element is configured by one transistor,
wiring that supplies the reset signal is connected to an anode of the photodiode,
a control electrode of the transistor and a cathode of the photodiode are connected to one electrode of the capacitor,
one of two electrodes other than the control electrode of the transistor is connected to wiring that supplies a constant voltage, and the other of the two electrodes is connected to wiring that outputs the photoreception signal, and
wiring that supplies the readout signal is connected to another electrode of the capacitor.

6. The display device according to claim 2,
wherein the switching element is configured by a first transistor and a second transistor,
wiring that supplies the reset signal is connected to an anode of the photodiode,
a control electrode of the first transistor and a cathode of the photodiode are connected to one electrode of the capacitor,
one of two electrodes other than the control electrode of the first transistor is connected to wiring that supplies a constant voltage,
the other of the two electrodes other than the control electrode of the first transistor is connected to one of two electrodes other than a control electrode of the second transistor,
the readout signal wiring is connected to the control electrode of the second transistor,
the one of two electrodes other than the control electrode of the second transistor is connected to wiring that supplies the constant voltage, and
the other of the two electrodes other than the control electrode of the second transistor is connected to the readout wiring for output current.

7. The display device according to claim 1,
wherein the switching element is configured by a first transistor, a second transistor, and a third transistor,
wiring that supplies the reset signal is connected to a control electrode of the third transistor,
a control electrode of the first transistor, a cathode of the photodiode, and one of two electrodes other than the control electrode of the third transistor are connected to one electrode of the capacitor,
one of two electrodes other than the control electrode of the first transistor is connected to wiring that supplies a constant voltage,
the other of the two electrodes other than the control electrode of the first transistor is connected to one of two electrodes other than a control electrode of the second transistor,
the readout signal wiring is connected to the control electrode of the second transistor,
the one of two electrodes other than the control electrode of the second transistor is connected to wiring that supplies the constant voltage,
the other of the two electrodes other than the control electrode of the second transistor is connected to the readout wiring for output current,
the other of the two electrodes other than the control electrode of the third transistor is connected to wiring that supplies the constant voltage, and
an anode of the photodiode and another electrode of the capacitor are connected to ground wiring.

8. The display device according to claim 1, further comprising:
a common substrate opposing the active matrix substrate; and
liquid crystal sandwiched between the active matrix substrate and the common substrate.

* * * * *